Aug. 8, 1972 R. R. RUSSO 3,682,785
PROCESS FOR FORMING AN ISOLATED CIRCUIT PATTERN ON A CONDUCTIVE SUBSTRATE
Filed March 30, 1971
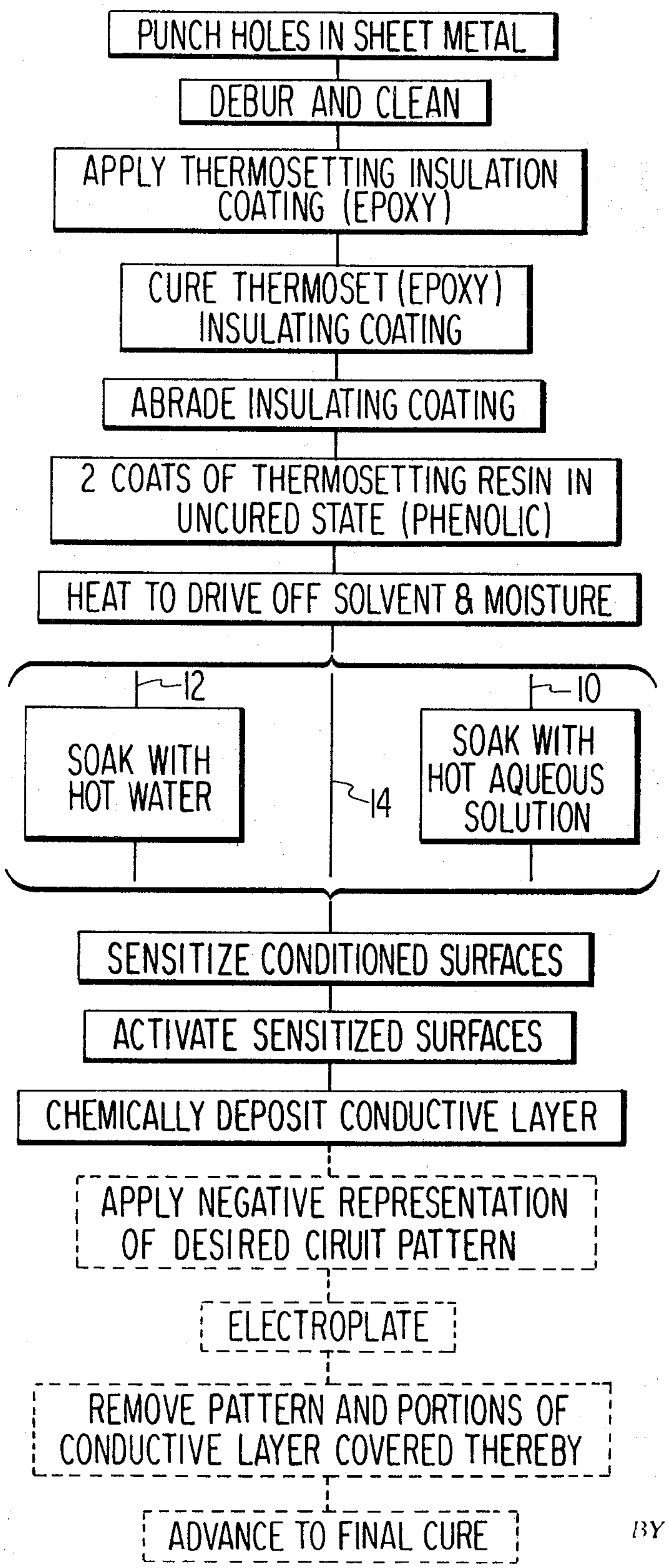
INVENTOR.
Robert R. Russo
BY
ATTORNEY 3,682,785
PROCESS FOR FORMING AN ISOLATED CIRCUIT PATTERN ON A CONDUCTIVE SUBSTRATE

Robert Ritter Russo, Indianapolis, Ind., assignor to RCA Corporation

Filed Mar. 30, 1971, Ser. No. 129,392
Int. Cl. C23b 5/48, 5/60
U.S. Cl. 204—15 13 Claims

ABSTRACT OF THE DISCLOSURE

A metal plate with punched through holes is used as the substrate for a printed circuit board by applying a first coating of an epoxy polymer from a fluidized bed of epoxy powder and then cured thereon. The cured epoxy coating is then abraded. A second and third coating of a phenolic mixture is applied over the first coat by dipping and drying respectively in sequence in a liquid tank of a phenolic mixture. The double layer of partially cured phenolic mixture is abraded and soaked with water or chemically treated with a mild acidic aqueous solution before conventional electroless deposition thereon preparatory to electrolytically depositing a printed circuit of desired configuration.

CROSS REFERENCES TO RELATED APPLICATIONS

This application is related to copending applications Ser. Nos. 30,552, 30,553 and 30,554, all filed respectively on Apr. 21, 1970, and all three of which applications have been assigned to the same assignee as the present application.

This invention relates to additive circuit techniques, and, more particularly, to improved techniques for forming an isolated conductive pattern on a metal substrate.

The two techniques generally available for the fabrication of printed circuit boards are the subtractive or "etch-down" technique and the additive or "build-up" technique.

The majority of printed circuits presently in commercial use are fabricated using subtractive techniques. These techniques generally entail selectively etching away unwanted copper from a sheet of copper clad dielectric material to arrive at the desired circuit pattern.

Additive techniques, wherein the circuitry is added to an unclad base substrate, have been less commonly used in the past. The desirability of manufacturing double sided boards incorporating plated through holes, however, has substantially increased the use of additive techniques. Furthermore, it is sometimes desirable to form the circuitry on a conductive metal substrate in which case special steps must be taken to isolate the circuitry from the conductive substrate.

One of the major problems associated with making printed circuits using additive techniques is to provide a strong bond between the base substrate and the added circuitry. The standard by which this is measured in the industry is referred to as peel strength. Peel strength is generally defined in terms of pounds per inch (p.p.i.) and is measured by peeling a one inch wide strip of the coating from the coated surface at an angle of 90° and a peel rate of 2 inches per minute. The Mil. Spec. P13949D specifies a peel strength of 8 pounds per inch for one ounce copper-clad laminates as a minimum standard for printed circuit patterns. Commercial printed circuits generally require peel strengths of 8 to 12 pounds per inch.

In the case of subtractive techniques, peel strength requirements have not prseented any major difficulty primarily because the base substrate is supplied to the printed circuit fabricator with a uniform cladding of conductive metal which is generally laminated to the substrate using appropriate adhesives, heat, and pressure. After the undesired portions of the cladding are etched away, the unveiled circuitry remains tightly bonded to the base laminate, i.e. peel strengths are in the order of 8–12 p.p.i. In the case of additive techniques, however, the resultant peel strength is solely a function of the deposition process and any pretreatment of the substrate that may be employed.

In the formation of conductive patterns on a non-conducting surface by means of additive processes according to the prior art, the sequence of steps generally followed includes sensitizing the surface of a non-conductive substrate with a reducing agent; activating the sensitized surface in a solution of a noble metal salt; chemically or "electrolessly" depositing a relatively thin layer of conductive material upon the activated surface, and electrolytically depositing the conductive pattern to a desired thickness. Experimentation has shown that the bonds formed between the electrolessly deposited material and the non-conducting surface are essentially physical in nature. Furthermore, where the non-conducting base material exhibits a substantially smooth surface, low peel strengths, e.g. less than one pound per inch, are not uncommon. Several methods have been used previously to improve this bond strength. These have included erosion techniques, such as chemical etching or physical abrasion to roughen the surface of the base material, or the use of adhesive layers between the non-conducting base material and the electrolessly deposited conductor. Such chemical methods have been successfully developed for plastics such as acrylonitrile-butadiene-styrene (ABS), polysulfone and polypropylene, whereby a surface is produced which provides good bonds with subsequently deposited metals. Chemical treatment of other plastics, for example the phenolics and epoxies commonly used in printed circuit fabrication, does not produce a significant improvement in adhesion. Physical abrasion methods improve the adhesion slightly though not sufficiently to pass peel strength requirements for printed circuit applications.

Adhesive layers, on the other hand, have resulted in relatively good bond strengths and much work has been done towards their incorporation into printed circuit manufacture. To date, however, these adhesive techniques have proven to be difficult to control and have resulted in poor reproducibility.

To overcome these problems, attempts have been made to promote the adhesion of subsequently deposited conductors to adhesive layers by sprinkling particles thereupon and either plating directly upon the projecting surface area of the particle impregnated layer, or by removing the particles from the adhesive layer and plating upon the roughened surface area remaining. See for example U.S. Pats. 2,739,881; 2,768,923; and 3,391,455. Further attempts have been made to promote the adhesion of subsequently deposited conductors to adhesive layers by pretreatment of the adhesive layer; for example, the recognition that adhesion improves due to advancement of the adhesive layer from an uncured state to a partially cured state prior to conductor deposition. See for example, U.S. Pats. 2,680,699; 3,035,944; 3,052,957; and 3,267,007.

In the formation of conductive patterns on conductive metal substrates, by means of additive processes according to the prior art, the substrate is first coated with a dielectric material, for example by a fluidized bed process as disclosed in U.S. Pat. 3,296,099, and thereafter processed as a nonconducting substrate in accordance with the prior art techniques discussed above.

Of the proposals made heretofore for manufacturing printed circuits on insulated metallic substrates, none has adequately solved the problem of providing such circuits with peel strengths that are consistently within a desired range such as 8 to 12 pounds per inch. One of the problems that occur in the use of substrates provided with through-holes is to prevent the through-holes from becoming clogged, while insulating the surface of the substrate.

Furthermore, prior art proposals usually involve costly procedures and chemicals that nevertheless have not proved to solve adequately the problem of achieving consistently high-peel-strength printed circuits.

The present invention solves these problems by utilizing several layers of resinous insulating partially cured compositions each layer being applied in sequence over a cured layer of a resinous composition.

In accordance with a preferred embodiment of the present invention, a layer of cured epoxy resin in the range of 0.005 to 0.031 inch is applied to the surface of a metallic substrate provided with through-holes. A first layer of phenolic resin mixture is applied over the cured epoxy resin layer by a dipping process to develop thereover a very thin layer in the order of 0.0003 (3/10 mil). This layer is heated only sufficiently to drive off solvents of the resin mixture and yet not cure the resin. A second also similarly very thin layer of the phenolic resin is applied over the first uncured layer by dipping and similarly heated. Usually, the dipping steps cover the surface and the hole surfaces without clogging. Suitable means to clear any clogged holes by air pressure, for example may be used if there is a tendency to clog the holes during the dipping steps. The surface of the composite coated metallic substrate is (first) then abraded, (second) subsequently treated with a hot water or hot weak acid solution to initiate stressing of the surface and the surfaces exposed by abrasion of the second phenolic layer by water absorption or chemical reaction and, (third) treated with an oxidizing conditioner to develop a microporous surface by physical rupturing of the above-stressed surfaces. The oxidizing conditioner develops the micro-openings by what is believed to be both an action of chemical etching of the surfaces as well as an action of removal of adsorbed and absorbed water on such surfaces. The micro-openings serve as sites for bonding subsequently deposited metal for obtaining significantly higher peel strengths than heretofore have been obtained in the art. The surfaces are then exposed to conventional sensitizing, activating and electroless solutions for electroless deposition of the desired printed circuit pattern.

The present invention will be described with more specificity hereinafter, and will be best understood upon reading the following description in conjunction with the flow diagram appearing in the drawing.

Turning now to a detailed description of a method for manufacturing printed circuit boards in accordance with the present invention, the bare metal substrate, upon which the circuit is to be formed, is punched or drilled in accordance with the desired through-hole configuration, with diameters between 0.030 to 0.125 inch.

Suitable metal substrates are typically made of steel, aluminum or brass sheets having a thickness in the order of 0.015 to 0.125 inch. Such substrates are considered to be suitable for most television and computer panels carrying printed circuits and associated electronic components.

Thereafter, the substrate is deburred, cleaned and degreased, for example, by passing it through an alkali etch or preferably a dilute nitric acid bath.

The metal substrate is then dried at a temperature in the range of 100°–200° F. for 1–10 minutes. Thereafter it is preheated for the initial coating step by hot air at temperatures in the range of 400°–850° F. for 5–30 minutes. The temperature and time periods required will be dependent on the material selected for the initial coating.

After the metal substrate has been cleaned, dried and preheated it is immersed in a conventional fluidized bed of resin, preferably, epoxy resin. Detailed information relating to terminology and definitions of a fluidized bed may be found in an article entitled "Fluidized Nomenclature and Symbols," Industrial and Engineering Chemistry, vol. 41, No. 6, pp. 1249–1250, June 1949. A suitable procedure of applying epoxy resin by means of a fluidized bed is disclosed in U.S. Pat. 3,296,099 issued Jan. 3, 1967.

The epoxy may be a thermo-setting epoxy resin such as Corvel ECA–1283 sold by the Polymer Corporation, Reading, Pa. and Vibro-Flo E–208 sold by the Armstrong Resins Corporation, Warsaw, Ind.

The metal substrate is allowed to remain in the fluidized bed only a sufficient time to build up a coating on both surfaces and on the hole surfaces of a thickness in the range of 0.005 to 0.031 inch, the final I.D. (inside diameter) of the through-holes being determined by the thickness of the coating. The epoxy coating applied in the fluidized bed does not clog or fill the through-holes in the substrate since the epoxy powder is in an agitated state responsive to the pressurized air or other gas used in such beds, any tendency to fill or clog the holes being prevented by such action.

After the fluidized-bed dipping step the epoxy coated substrate is cured by hot air typically in the range of temperatures of 300°–500° F. for a period of 5–15 minutes. Thereafter the epoxy coated substrate is cooled.

The substrate is then passed on a suitable conventional conveyor system for providing mechanical abrasion of the epoxy surface. The abrasion step is suitably performed either with a rotating brush contacting the epoxy surface or with a spray of grit such as aluminum oxide or sand directed over the surface. The epoxy surface is abraded to provide a deglazed surface for receiving the subsequent insulating coatings. The deglazed surface is then cleaned, in preparation for the next steps. The thickness of the epoxy coating following the curing and abrading steps is preferably 0.013 inch on each face. The thickness of this cured epoxy coating is chosen in accordance with the expected end use of the printed circuit as will be apparent to those in this art.

A very thin coating of a phenolic composition is next applied over the abraded cured epoxy layer. The phenolic composition, which is in an uncured state when applied, may be a polyvinyl acetal modified phenolic resin such as a polyvinyl butyral phenolic mixture. The composition designated as Bondmaster E–835 and sold by the Pittsburgh Plate Glass Company, Bloomfield, N.J., has been successfully used for this purpose.

The phenolic resin solution is preferably of low viscosity, so that it does not clog or fill the holes of the substrate during or after the dipping step. According to the invention reliable results consistently are obtained wherein no holes are clogged and yet a well-bonded insulating coating is developed on the epoxy coating, by applying two coats of the phenolic resin in separate steps. The preferred resin is type MR–86A sold by Pittsburgh Plate Glass. This resin is generally a phenolic resin having 12.5% to 14.5% solids. This resin is preferably thinned with sufficient conventional solvent, such as E–835 Thinner sold by Pittsburgh Plate Glass, to reduce the solid content of the resin to 8%. This resin solution produces, by a very quick dipping procedure, a very thin coating of the phenolic resin in an uncured state on the epoxy-coated substrate of about 0.0003 inch (3/10 mil) on each face.

The dipping steps are done at room temperature. After the first dipping step, the uncured phenolic coating is dried by air in a vented hood at room temperature for a period of 30 seconds to 5 minutes so that all of the vaporizable solvents are dried from the coating. The thin coating is not heated to temperature levels or for time periods which could cure the resin. According to the invention this dipping and drying procedure assures that the surface is receptive to a second coating of the phenolic resin to provide optimum bonding.

The second coating of the same phenolic resin is applied similarly by dipping for a time only to coat the board with about 0.0003 inch (3/10 mil) of the uncured resin on each of the both faces.

Subsequent to the second dipping, the panel is dried by air in a vented hood at room temperature for 30 seconds to 5 minutes depending on the time needed to drive off sufficient of the solution solvent and free moisture in the coating layers to prevent blistering in the following heating step. If needed, suitable hole-clearing means such as air pressure may be used to clear clogged holes after either of the dipping steps.

The panel is then heated by hot air at temperatures in the range of 250°–400° F. for a period of 30 seconds to 10 minutes. The temperature and the time of heating air needed to partially cure both the outer as well as the inner coatings of phenolic resin will be readily determined depending on the materials used and the thicknesses selected. According to the invention, it should be noted, the outer phenolic layer must not be cured. It is preferred that the phenolic coatings be heated sufficiently only to drive off the solvent solutions and any free moisture of the surface or subsurface portions of the layer. The phenolic layers under these conditions provide the basis for the subsequent treating of that surface preparatory to the electroless deposition of the conductive layer which will serve as the base for the desired printed circuit to be added by electrolytic technique.

The panels are thereafter permitted to cool. The dry film thickness of the resinous coatings, over the cured epoxy coating should be sufficient to adequately insulate the metal substrate from the subsequently deposited circuitry.

It should be noted that although the thermosetting epoxy and phenolic resinous compositions applied to the metal are selected so as to be adhesively compatible with the metal substrate, they are not selected, nor is it necessary, for them to be adhesively compatible with the subsequently deposited conductor layer; i.e. vis-a-vis the conductive layer to be subsequently deposited, it appears as a non-conductive substrate and not as an adhesive layer.

The coated panel is then passed through a cold water spray for 15–20 seconds and the coated surfaces uniformly abraded for example by rotating brushes coated with very fine aluminum oxide or the like. In actual practice, Scotch-Brite-Redi-Load No. 70–A brushes, made by the 3M Company, have been successfully used. Regardless of the technique used to perform the uniform abrading, whether by the mechanical technique described or by other means, the purpose of this step is to provide break-through in the surface of the coating. The panel is then passed through a further water spray rinse. This rinsing step serves principally to rinse abraded particles from the panel. In addition, the rinse wets the abraded surface with sufficient water to react with the oxidizing conditioner for those processes in which the soaking step is not used, as will be described.

After the coated panel has been surface abraded it is soaked in hot water at temperatures ranging from 110° F. to 200° F. for a period of 60 minutes for the low temperatures such as 110° F. and 15 minutes for the higher temperatures such as 200° F. or in a dilute nitric acid solution maintained at a temperature of 110°–140° F. for a period of 2–15 minutes. This treatment results in an absorption and adsorption of water by the abraded surface. The preferred step for effecting this absorption and adsorption of water is as follows: The abraded panel is soaked by being passed through a spray machine charged with a dilute nitric acid solution. The sprayer may be of conventional design using, for example, titanium and PVC polyvinyl chloride construction with suitable controls and ventilating equipment. It should be equipped to hot spray rinse and hot air dry the panels thoroughly, immediately after soaking. The soaking solution is prepared, for example, by adding nitric and hydrochloric acids to deionized water to yield a nitric acid concentration of 10±1% by volume and a hydrochloric acid concentration of 5±1% by volume and is maintained at a total acidity of 2.3±.2 normal. The abraded panel is exposed to the nitric-hydrochloric solution for approximately 2 minutes; the solution being maintained at a temperature of 130° F. ±3° F. After exposure to the solution the panels are rinsed in hot water (130°±5° F.) for about 30 seconds. The use of a nitric acid solution is preferred at this step although other aqueous solutions such as mild, basic or acid solutions as well as hot water will be adequate for this step. Regardless of the technique employed, the purpose of this soaking step is to absorb water by the abraded surface.

Thereafter, the panels are prepared for the subsequent electroless plating deposition by treatment with a strong oxidizing conditioner.

The panels after the soaking step must not be allowed to dry out as would occur by interrupting the process and storing the panels prior to the next step of treatment with the oxidizing conditioner. It has been found that a period no greater than four hours is the maximum period that the panels after the soaking step should be allowed to stand without proceeding to the next step of the process to prevent the soaking step from being degraded.

The conditioner may be of the chromic acid type, in general, commercially available, such as Enthone's Enplate 470 in solution form. In its commercial form, the Enplate 470 conditioner has a $CR^{+6}$ ion activity of from .6–1.0 normal, with .8 normal as nominal. Improved results are achieved by increasing the activity of the commercially available Enplate 470 conditioner by the addition of an additive comprising a $CR^{+6}$ compound such as chromium trioxide ($CrO_3$) or a metal chromate to raise its activity between 2.4–3.2 normal. Stated another way, considering the commercially available Enplate 470 conditioner as having an activity level of 100% at nominal, it is raised to an activity level of 350±50%. This may be accomplished by adding two ounces of Enthone's Enplate 470 additive (chromic acid in solid form) per gallon of commercially available Enthone's Enplate 470 conditioner (solution form) for each 10% increase in activity desired. The conditioning solution is preferably maintained at a temperature of 113±3° F. and at a specific gravity of from 1.52–1.57. The concentration of sulfuric acid present is preferably maintained at 52±4% by volume, and the tri-valent chromium ion content is advantageously not permitted to exceed 2 ounces per gallon.

Prior to the oxidizing conditioning step the panels are rinsed in a tap water typically (75°±5° F.) spray for 15–60 seconds. The panels are then exposed to the activated oxidizing conditioner for 20–40 seconds, depending on the activity level thereof, according to the following schedule:

| Activity (in percent): | Exposure time sec. |
|---|---|
| 300–330 | 40 |
| 330–370 | 30 |
| 370–400 | 20 |

Immediately thereafter, i.e. within a period of approximately 20 seconds, the coated panel is thoroughly rinsed with and immersed in tap water (75°±5° F.), and then rinsed by immersion in deionized water.

Following the deionized water rinse, the conditioned panels are immersed in a sensitizng reducing agent solution, such as stannous chloride ($SnCl_2$), for 60–180 seconds, with mild mechanical agitation.

A typical formula for a sensitizing reducing agent solution is:

| | |
|---|---|
| Stannous chloride ______gm./l__ | 10 |
| Hydrochloric acid ______ml./l__ | 40 |
| pH ______ | >1 |
| Temperature ______ | Room |
| Time ______minutes__ | 1–2 |

Depending upon the nature and the composition of the partially cured layer treated in accordance with the invention upon which the sensitizing reducing agent is to be used, any of the conventional wetting agents may be used to enhance the sensitizing step. In practice, a solution formed by mixing one part of Enthone's Enplate 432 sensitizer to 15 parts of deionized water, by volume, is used. This is followed by immersion rinsing first in tap water (75°±5° F.) and then in deionized water.

After rinsing the sensitized panels are immersed in an activating solution of a noble metal salt, such as palladium chloride ($PdCl_2$), for 60–120 seconds, with mild mechanical agitation. In practice, a solution formed by mixing one part of Enthone's Enplate 440M activator to 15 parts of deionized water, by volume, is used. This is followed by immersion rinsing, first in tap water and then in deionized water.

Thereafter the activated panels are panel plated in an electroless copper bath, controlled at a temperature of 75°±5° F., for approximately 10 minutes. This immersion is accompanied by mild air plus mechanical agitation to provide approximately a .00001″ thick layer of electrolessly deposited copper on the activated surface. The electroless bath may be formed by mixing 3 parts by volume of Enthone's Enplate CU–402A, 3 parts Enplate CU–402B and 4 parts deionized water. The panel plated boards are then rinsed in tap water and forced air dried at a temperature of 140°±10° F. for 60–120 seconds.

Following the electroless deposition, the plated panels are imprinted on one side with a negative representation of the desired circuit configuration; i.e. the electrolessly deposited copper is left exposed in accordance with the desired circuit pattern. This negative representation may be applied by any one of a number of conventional techniques. In practice, it has been found desirable to use screen printing techniques and to form the pattern with a screen resist such as Dynachem 2004–70M. After screening the resist is permitted to air dry for a minimum of 3 minutes and then cured for a minimum of 60 seconds in an infra-red oven followed by 90 seconds in a forced hot air ventilated oven at 150°±10° F. Thereafter the panels are turned over and the foregoing step repeated.

Next the printed panels are acid cleaned for 15–20 seconds in a 10% solution of sulfuric acid at 70–75° F. and immersion rinsed in tap water. Thereafter the panels are immersed into the first of a three stage pyrophosphate electrolytic copper bath, maintained at a temperature of 130±2° F., for 2 minutes, at a current density of 2.5 amperes per sq. ft. The panels are agitated to force the plating solution through the holes. Next the panels are consecutively immersed into the second and third stages of the pyrophosphate bath for 15 and 55 minutes, at current densities of 13.5 and 30 amperes per sq. ft. respectively, each at a temperature of 130±2° F., with accompanying agitation. The electroplated panels are then rinsed in water and the rinsing step followed by hot air drying at a temperature of 160±5° F., for 3–4 minutes.

The pyrophosphate bath is operated at a chemical concentration as follows:

Copper (as metal)—2.5 to 4.0 ounces per gallon with 3.0 ounces per gallon as nominal;
Pyrophosphate—17.5 to 28.0 ounces per gallon with 21.0 ounces per gallon as nominal; and
Ammonia ($NH_3$)—.20 to .40 ounce per gallon with .30 ounce per gallon as the nominal.

The ratio by weight of pyrophosphate to the copper material is critical and should be maintained at a ratio of from 7:1 to 7.5:1 and at a pH of from 8.0 to 8.5. After exposure to the pyrophosphate bath, the thickness of the copper circuit configuration measures approximately .001″–.003″.

Next the plated circuit boards are processed through a trichloroethylene spray followed by brush scrubbing and an air knife to remove the plating resist.

After the plating resist is removed, the boards are processed through an etching machine charged with ammonium persulphate for the purpose of removing the layer of electroless copper left exposed after the removal of the resist. From the etcher, the circuit boards are spray rinsed and dried by an air knife to leave them moisture free.

The cure of the resinous compositions with which the board was initially coated is advanced by the various steps of the process. To optimize peel strength, however, it is essential that the resinous compositions be fully cured and devoid of residual moisture. Final curing is insured by the subsequent application of heat. For example, where the board is subsequently coated with a solder resist and/or imprinted with a circuit schematic, such steps are accompanied by a drying step at a temperature sufficient to cure the resin. Alternatively, final curing may be achieved by conventional wave soldering after the circuit components have been mounted upon the board.

Although the theory of the action effected by the partially cured layer of the thermo-setting resin is not fully understood it is believed that the process of the invention does cause structural alteration of the surface whereby better adhesion occurs. When the surface is abraded, scratches are developed in the surface. These scratches when exposed to the soaking step utilizing either water or an aqueous acidic or basic solution results in a high degree of water absorption into the surface near and beneath the scratches. It is believed that these scratches open up the subsurface portions and thereby serve as accesses for the subsequent soaking conditioning solutions that are applied to the surface. The treatment of these accesses develops micro-openings to increase the surface area by cracks, crevices, and pores which in turn act as sites for the subsequent electroless deposition step. In practicing the invention observations have been made which indicate that the abraded layer when exposed to the soaking step appeared to swell. The conditioner when applied to the water-absorbed surface reacted to effect a high degree of micro-opening development on the surface of the adhesive. It is not known whether the development of micro-openings is caused by the removal of water from the abraded surface or whether there is a reaction by the conditioner with the resin material, the water in the access ports serving to guide the conditioner into subsurface portions. Nevertheless, in view of the data previously given there is a marked improvement in the printed circuits made in accordance with the steps of the present invention.

In practice, a preferred form of the invention includes the steps of (1) abrading, (2) soaking with an aqueous acid solution and (3) conditioning with a strong oxidizing agent such as chromic acid the uncured surface of the phenolic resin to achieve an optimum or maximum peel strength for the printed circuit. This is illustrated in the flow diagram with alternative 10.

Another embodiment includes the use of a basic aqueous solution such as a mild solution of sodium hydroxide illustrated also by path 10 of the flow diagram.

Water at temperatures ranging from 130° to 200° F. may be used for the soaking step if the soaking is carried out for longer period of time than with an aqueous acidic solution. A printed circuit prepared with the use of water at a temperature of 200° F. for 20 minutes for the soaking step had a peel strength comparable to a printed circuit prepared with an aqueous acid solution for the soaking step. This is illustrated in the flow diagram as alternative flow path 12.

A useful printed circuit having reduced peel strength can be made by the elimination of the soaking step. Thus the abrasion and oxidizing conditioning steps without the soaking step together will produce a printed circuit with a peel strength of about one half the value of a printed circuit that is prepared to include the soaking step, all other conditions and steps of the process of the invention otherwise being followed. This embodiment is illustrated in the flow diagram by alternative flow path 14.

Thus, sufficient water to react with the oxidizing conditioner is provided by wetting the abraded surface with the water spray rinse on the panel after the abrasion step as outlined in the detailed description given above. It will be understood that soaking the abraded panel provides for a higher degree of water absorption while a rinse to wet the abraded panel results in less water absorbed on and into the abraded surface.

It should be understood that in the above description of a preferred form of the invention, the conditions of temperature of each of the respective steps or solutions and the time period during which the panel is being processed through the steps or solutions are that for a process developed for manufacturing printed circuits. Accordingly, the variations of temperature and the time periods indicated are kept within well-defined limits by suitable control systems following good manufacturing practices. Various departures may be made in the temperatures and time periods as well as the thicknesses of various coatings given in the description following the principles of the invention as will be apparent to those skilled in this art.

What is claimed is:

1. A process for forming an isolated printed circuit pattern on a conductive substrate, comprising the steps of:

(a) applying a thermo-setting epoxy resin over at least one surface of said substrate;

(b) curing said epoxy resin;

(c) applying over said resin surface a first thin coating of an uncured mixture of a thermo-setting resinous phenolic solution or dispersion, said mixture being adhesively compatible with said cured epoxy coating and capable of absorbing an aqueous solution;

(d) drying without heating said first thin coating;

(e) applying over said first thin coating a second thin coating of said uncured mixture of a thermo-setting resinous phenolic solution or dispersion;

(f) drying without heating said second thin coating;

(g) heating said first and second coatings to drive off any solvent and moisture therein to solidify same;

(h) uniformly abrading the surface of said second coating to expose the subsurface for subsequent soaking;

(i) treating said abraded surface with an aqueous solution to soak the subsurface portions of said surface;

(j) further treating said abraded surface with an oxidizing conditioner to react with the absorbed aqueous solution to develop micro-openings in said surface;

(k) sensitizing said conditioned surface with a reducing agent;

(l) activating said sensitized surface with a solution of a noble metal salt;

(m) chemically depositing a relatively thin layer of conductive material upon said activated surface, said layer exhibiting sufficient electrical conductivity to permit subsequent electroplating thereto;

(n) applying a negative representation of the desired circuit pattern upon said conductive layer;

(o) electrolytically depositing metal on the portions of said layer of conductive material not covered by said applied pattern;

(p) removing said applied pattern and those portions of said layer covered thereby; and (q) subsequently advancing said resinous composition to a fully cured state.

2. The process in accordance with claim 1 wherein said thermo-setting resinous composition is a polyvinyl acetal modified phenolic resin.

3. The process in accordance with claim 2 wherein said polyvinyl acetal modified phenolic resin is a polyvinyl butyral phenolic mixture.

4. The process in accordance with claim 1 wherein said oxidizing conditioner comprises a chromic acid solution.

5. The process in accordance with claim 4 wherein said chromic acid solution has a $CR^{+6}$ ion activity level of between 2.4 and 3.2 normal.

6. The process in accordance with claim 5 wherein said abraded substrate is treated with said chromic acid solution for a period of from 20 to 40 seconds depending on the activity level of said $CR^{+6}$ ion.

7. The process in accordance with claim 1 wherein said aqueous solution comprises a nitric acid solution.

8. The process in accordance with claim 7 wherein said nitric acid solution has a nitric acid concentration of less than 20% by volume.

9. The process in accordance with claim 8 wherein said solution comprises a nitric acid concentration of $10\pm1\%$ by volume and a hydrochloric acid concentration of $5\pm1\%$ by volume.

10. In a process for forming an isolated printed circuit pattern on a conductive substrate having holes therein, wherein said substrate is made electrically conductive and thereafter electroplated on isolated portions thereof, the improvement of:

applying to the surface of the conductive substrate a cured epoxy resin coating, applying an uncured phenolic resin coating over the epoxy coating, applying a second uncured phenolic resin coating over the first phenolic coating, each of said phenolic coatings being sufficiently thin as to keep clear the holes in the substrate, and thereafter abrading, aqueously wetting, and oxidizing said phenolic surface in sequence prior to rendering the surface electrically conductive, whereby the abraded phenolic surface is aqueously wetted prior to the oxidizing step to develop thereby micro-openings in the surface.

11. A process according to claim 10 wherein the step of aqueously wetting the phenolic surface after abrading and prior to the oxidizing step comprises the use of water at a temperature of at least 110° F. and not more than 200° F.

12. A process according to claim 10 wherein said aqueously wetting step comprises the use of nitric acid.

13. A process according to claim 10 wherein said aqueously wetting step comprises the use of a mild solution of sodium hydroxide.

References Cited

UNITED STATES PATENTS

| | | | |
|---|---|---|---|
| 3,296,099 | 1/1967 | Dinella | 204—15 |
| 3,514,538 | 5/1970 | Chadwick et al. | 204—15 |
| 3,052,957 | 9/1962 | Swanson | 204—15 |
| 3,267,007 | 8/1966 | Sloan | 204—15 |
| 3,434,867 | 3/1969 | Rousselot | 117—47 |

FOREIGN PATENTS

| | | | |
|---|---|---|---|
| 1,110,765 | 4/1968 | Great Britain | 204—30 |

JOHN H. MACK, Primary Examiner

T. M. TUFARIELLO, Assistant Examiner

U.S. Cl. X.R.

117—47 A; 204—20